United States Patent [19] [11] 4,000,429
Yoshida et al. [45] Dec. 28, 1976

[54] SEMICONDUCTOR CIRCUIT DEVICE

[75] Inventors: Kenji Yoshida, Machida; Kazunori Oouchi, Yokohama, both of Japan

[73] Assignee: Tokyo Shibaura Electric Co., Ltd., Kawasaki, Japan

[22] Filed: May 6, 1975

[21] Appl. No.: 574,874

[30] Foreign Application Priority Data

May 7, 1974 Japan .......................... 49-49701

[52] U.S. Cl. .......................... 307/246; 307/205; 307/214; 307/238; 307/270; 307/DIG. 5
[51] Int. Cl.$^2$ ............... H03K 17/60; H03K 19/08; H03K 19/40; G11C 11/40
[58] Field of Search .......... 307/205, 214, 279, 251, 307/304, 238, 246, DIG. 5, 265–267, 268

[56] References Cited
UNITED STATES PATENTS

| 3,700,981 | 10/1972 | Masuhara et al. | 307/205 X |
| 3,778,783 | 12/1973 | Proebsting et al. | 307/279 X |
| 3,902,082 | 8/1975 | Proebsting et al. | 307/279 |

OTHER PUBLICATIONS

Atwood, "Field Effect Transistors"; *IBM Tech. Discl. Bull.*; vol. 6, No. 9, 91–93; 2/1964.
Kerins, "Low Power Circuit Design Using P–Channel MOS"; 1971 IEEE *Int'l. Convention Digest*; Session 4B; Paper 4B.2.; pp. 186–187.
Lohman, "Applications of MOSFETs in Microelectronics"; SCP and *Solid–State Technology* (pub.); pp. 23–29; 3/1966.
Falcoz et al., "Two–Phase Dynamic Logic with Enhancement Depletion Technology"; *IBM Tech. Discl. Bull.*; vol. 17, No. 9, pp. 2652–2653; 2/1975.

*Primary Examiner*—John S. Heyman
*Assistant Examiner*—Larry N. Anagnos
*Attorney, Agent, or Firm*—Oblon, Fisher, Spivak, McClelland & Maier

[57] ABSTRACT

A semiconductor circuit device comprises a first depletion type n-channel insulated gate field effect transistor (hereinafter referred to as IG-FET) having its gate and source electrodes connected to each other, a second depletion type n-channel IG-FET connected between the source electrode of the first n-channel IG-FET and a positive power source and having its source and gate electrodes connected to each other, an enhancement type n-channel IG-FET connected between the source electrode of the first IG-FET and ground and having its gate electrode connected to an input terminal, an output terminal connected to the drain electrode of the first IG-FET, and a capacitor connected to the above-mentioned output terminal and ground. When a potential on the above-mentioned input terminal is dropped down to zero volt, the first depletion type IG-FET is abruptly shifted to the ON state, causing the capacitor to be abruptly charged by a positive power source. When the potential on the above-mentioned input terminal is raised to a predetermined positive level, the capacitor is slowly discharged through a zero-volt channel i.e. a remaining channel of the first depletion type IG-FET whose gate electrode is biased to zero volt.

10 Claims, 18 Drawing Figures

FIG. 11
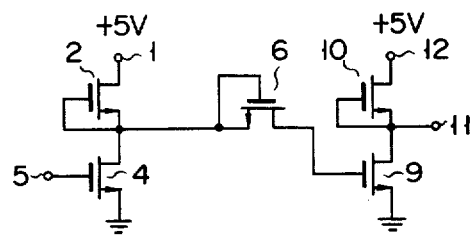
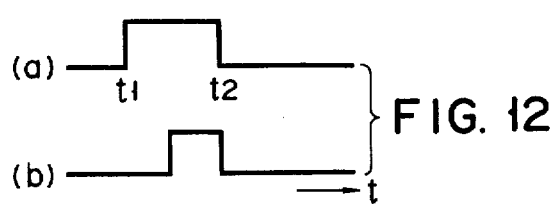
FIG. 12
FIG. 13
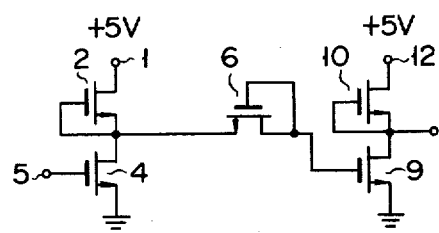
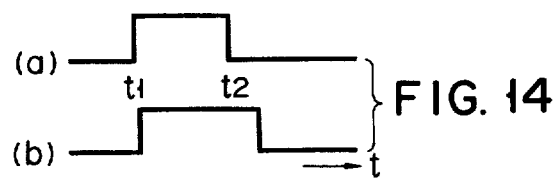
FIG. 14
FIG. 15
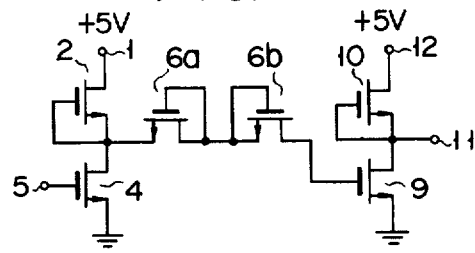
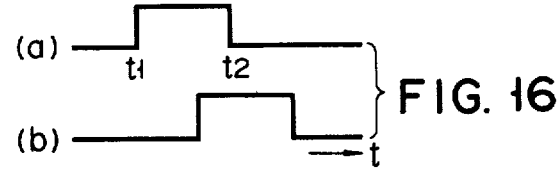
FIG. 16
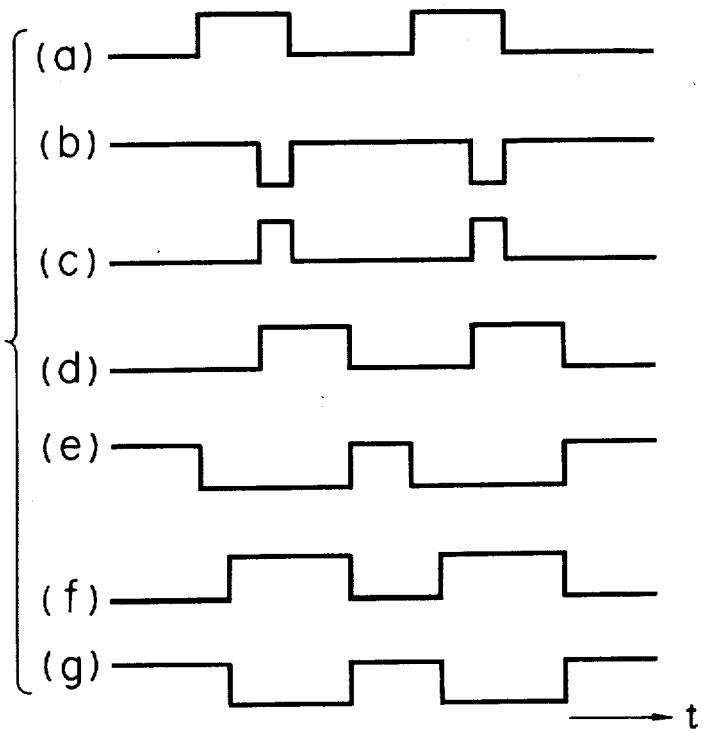
FIG. 18

SEMICONDUCTOR CIRCUIT DEVICE

BACKGROUND OF THE INVENTION

This invention relates to a semiconductor circuit device, and in particular a semiconductor device using a depletion type insulated gate field effect transistor (hereinafter referred to as IG-FET) as a transistor gate for the charging and discharging of a capacitance element, in which it is possible to obtain a great time difference between the delay of rise of a pulse signal on a node in the circuit device and the delay of fall of the pulse signal on the node in the cicuit device.

As a method for varying a rise-fall time ratio of a pulse signal on a node in a semiconductor cicuit device using the IG-FET, it has conventionally been practised to change a ratio of a conductance of a drive transistor to a load conductance of a gate circuit for driving the node in the above-mentioned semiconductor circuit. Since, however, the transfer characteristics and noise margin are dependent upon the ratio of the load conductance of the gate circuit to the conductance of the drive transistor, the margin of the transfer characteristic of the gate circuit is decreased with the resultant disadvantage.

SUMMARY OF THE INVENTION

It is accordingly the object of this invention to provide a semiconductor circuit device capable of obtaining a sufficiently great time difference between the charge and discharge of a capacitance on a node in the semiconductor circuit device.

According to this invention there is obtained a semiconductor circuit device comprising a transfer gate circuit including at least one depletion type IG-FET of one conduction type channel having first and second electrodes and a gate electrode connected to one of the first and second electrodes, and a capacitance charging and discharging cicuit connected to the input side of the transfer gate circuit so as to charge and discharge a capacitance present between ground and a node at the output side of the transfer gate circuit.

BRIEF DESCRIPTION OF THE DRAWING

FIG. 11 is a circuit diagram showing, by way of example, a waveform shaping circuit to which this invention is applied;

FIG. 12 is a waveform diagram for explaining the operation of the circuit of FIG. 11;

FIGS. 13 and 15 are circuit diagrams for showing further embodiments of the waveform shaping circuit;

FIGS. 14 and 16 are waveform diagrams for explaining the operations of the embodiments of FIGS. 13 and 15;

FIG. 18 is a waveform diagram for explaining the operation of the circuit of FIG. 17.

DETAILED DESCRIPTION OF THE PREFERRED EMBODIMENTS

In this specification, a channel of a depletion type IG-FET of which gate electrode is supplied with a zero-volt bias is referred to as a remaining channel, and only when the gate electrode of the IG-FET is forward biased with a predetermined voltage, the IG-FET is referred as ON state.

Figure 1:
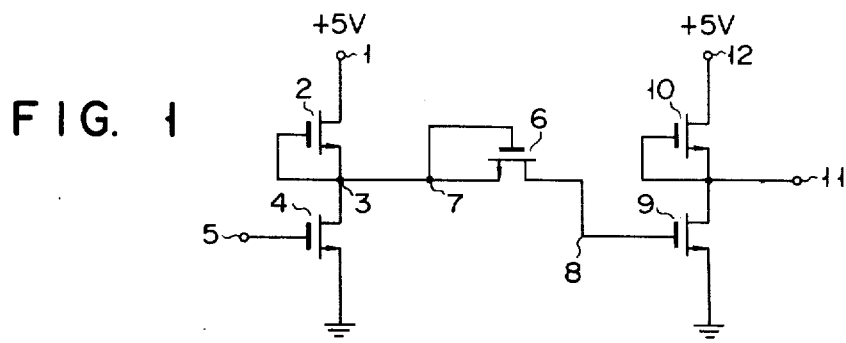
FIG. 1 is a circuit diagram showing a semiconductor circuit device according to one embodiment of this invention.

In FIG. 1, a depletion type n-channel IG-FET 2 has a drain electrode connected to the terminal 1 of a positive voltage power source of, for example, +5 volts. The gate electrode of the IG-FET 2 is connected through a node 3 to the source electrode of the IG-FET 2. To the node 3 is coupled the drain electrode of an enhancement type n-channel IG-FET 4. The IG-FET 4 has its gate electrode coupled to an input terminal 5 and its source electrode grounded. To the node 3 is coupled a common junction between the gate and source electrodes of a depletion type n-channel IG-FET 6 which constitutes a node 7. The drain electrode of the IG-FET 6 is connected through a node 8 to the gate electrode of an enhancement type n-channel IG-FET 9. The IG-FET 9 has its source electrode grounded and its drain electrode coupled to an output terminal 11 through a junction between the gate and source electrodes of a depletion type n-channel IG-FET 10. The drain electrode of the IG-FET 10 is connected to a terminal 12 of a positive power source of, for example, +5 volts.

Figure 2:
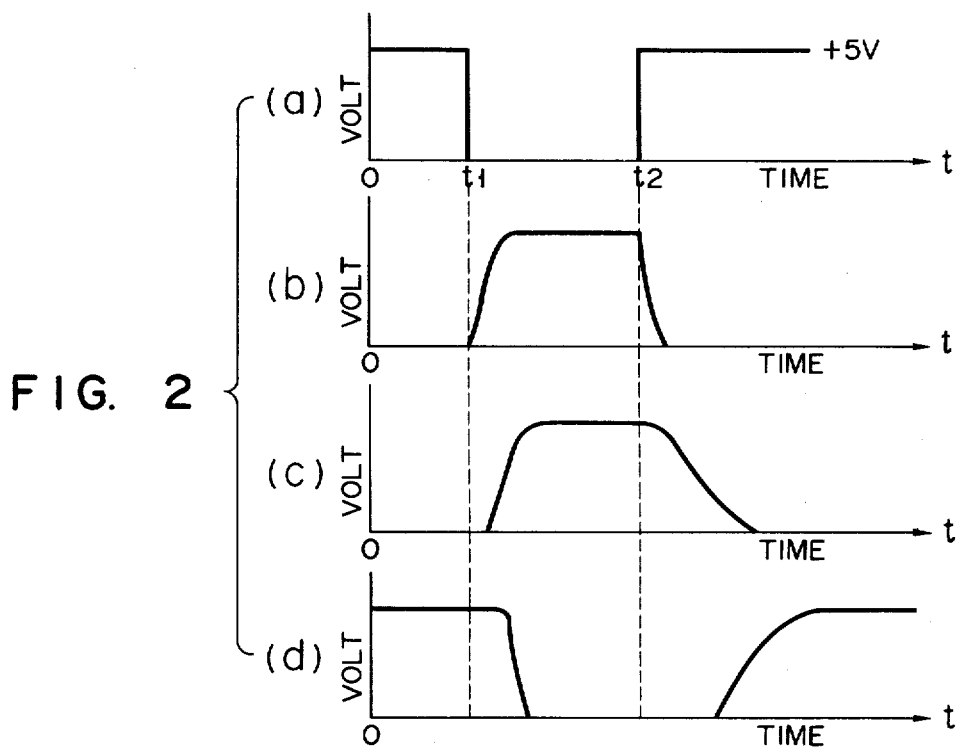
FIG. 2 is a waveform diagram for explaining the operation of the embodiment of FIG. 1.

The operation of the semiconductor circuit device of FIG. 1 will now be explained by reference to FIG. 2.

Since, at $t = 0$, a signal voltage applied to the input terminal 5 is +5 volts, the IG-FET 4 is in the ON state. The node 3 and thus the node 7 are substantially zero volt as shown in FIG. 2(b). Consequently, the node 8 coupled through the depletion type IG-FET 6 is zero volt as shown in FIG. 2(c) and the IG-FET 9 is in the OFF state. Since, at this state, the IG-FET 10 is turned ON, an output voltage on the output terminal 11 is about 5 volts, at $t = 0$, as shown in FIG. 2(d).

When, at $t = t1$, the signal voltage on the input terminal 5 is abruptly dropped down to zero volt as shown in FIG. 2(a), the IG-FET 4 is abruptly turned OFF and the potential on the node 3 is rapidly raised to +5 volts. As a result, the potential on the node 7 is also rapidly increased as shown in FIG. 2(b) to cause the IG-FET 6 to be rapidly rendered conductive. The potential on the node 8 is rapidly increased somwhat later than at $t = t1$, as shown in FIG. 2(c). This delay is ascribed to a time constant between a resistance between the source and drain electrodes of the IG-FET 6 and a stray capacitance such as the gate capacitance, capacitance between the connection wires and the substrate, junction capacitance etc. of the IG-FET 9 connected between the node 8 and ground. When the potential on the node 8 is rapidly raised as shown in FIG. 2(c), the IG-FET 9 is rapidly turned ON to cause the voltage on the output terminal 11 to be rapidly dropped down to zero volt as shown in FIG. 2(d).

When, at $t = t1$, the input voltage is increased stepwise to +5 volts as shown in FIG. 2(a), the IG-FET 4 is rapidly turned On and the potential on the node 7 is rapidly lowered to zero volt as shown in FIG. 2(b). As a result, the gate bias of the IG-FET 6 becomes zero volt, but the remaining channel is left between the source and drain electrodes of the depletion type IG-FET 6. The above-mentioned stray capacitance built up between the node 8 and ground is discharged little by little through the remaining channel left at the IG-FET 6 and through the IG-FET 4, and the potential on the node 8 is gradually decreased, at $t = t2$, as shown in FIG. 2(c) to cause the IG-FET 9 to be gradually turned OFF. Consequently, an output voltage at the output terminal 11 is gradually increased as shown in FIG. 2(d).

Figure 3:
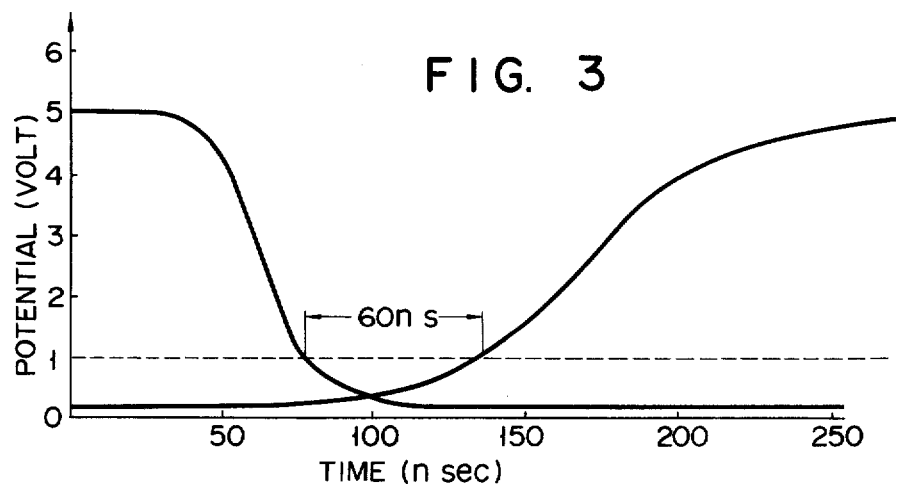
FIG. 3 is a characteristic curve showing the operation characteristic of the embodiment of FIG. 1.

In this way, the charge and discharge of the stray capacitance developed between the node 8 and ground is effected through IG-FET's 2 and 4 as a charge-discharge circuit and the depletion type of IG-FET 6 which serves as a transfer gate. At the charge time, the stray capacitance is rapidly charged to +5 volts through the IG-FET 2 and turned-ON IG-FET 6. At the discharge time, on the other hand, the stray capacitance is slowly discharged through the turned-ON IG-FET 4 and through the remaining channel of the IG-FET 6 whose gate voltage is zero volt. The time variation of the voltage on the output terminal 11 at the charge and discharge of the stray capacitance is as shown in FIG. 3. The origin of the time axis in FIG. 3 is at the time when the level of the input voltage is switched, for example, as shown at $t = t1$ and $t = t2$ in FIG. 2(a). A time required for the voltage on the node 8 to become 1 volt is about 78 nano-second at the discharge of the stray capacitance and about 138 nano-second at the charge of the stray capacitance, leaving a voltage difference of about 60 nano-second between them. In the case of 2 volts, a much more time difference results. If such a time difference is utilized, it is possible to prevent, for example, a mutual interference between the memory contents of memory cells at the write-in and read-out time and an erroneous operation at the time of reading out any data from the memory cell, as will be later described.

There will now be explained the other embodiments and modifications of this invention. The similar reference numerals are employed to designate parts or elements corresponding to those shown in FIG. 1 and any further explanation is therefore omitted.

Figure 4:
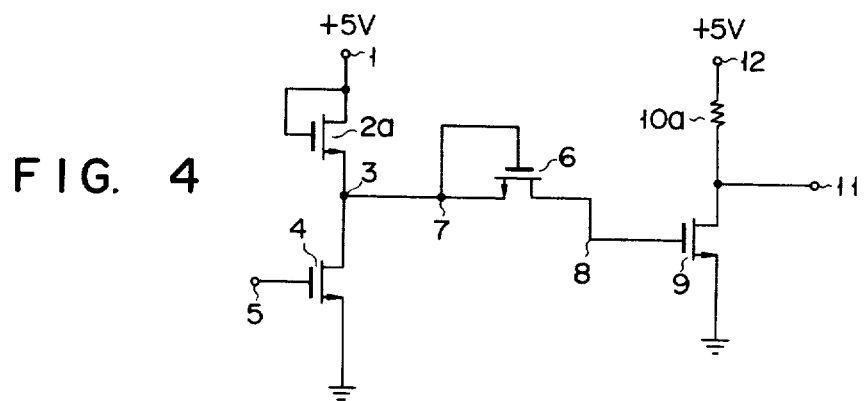
FIG. 4 is a circuit diagram showing a modification of the embodiment of FIG. 1.

In a modification shown in FIG. 4, an enhancement type n-channel IG-FET 2a having its gate and drain electrodes commonly connected to the positive power source 1 is used in place of the IG-FET 2 of FIG. 1 and a resistor 10a is used in place of the IG-FET 10 in FIG. 1. This circuit is operated in the same way as in FIG. 1.

Figure 5:
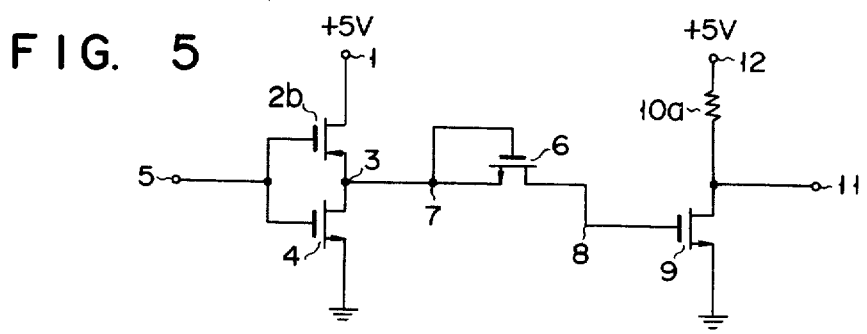
FIG. 5 is a circuit diagram showing another modification of the circuit of FIG. 1.

The FIG. 5 is similar in arrangement to the modification of FIG. 4, except that use is made, in place of the enhancement type IG-FET 2a in FIG. 4, of an enhancement type p-channel IG-FET 1b whose gate electrode is coupled, together with the gate electrode of the enhancement type n-channel IF-FET 4, to the input terminal 5, and the node 3 is connected to a junction between the source electrode of the IG-FET 2b and the drain electrode of the IG-FET 4. If a signal voltage on the input terminal 5 is, for example, +5 volts, the IG-FET 2b is turned OFF, while the IG-FET 4 is turned ON, and a voltage on the node 3, as well as on the node 7, is substantially zero volt. Since, in this case, the IG-FET 9 is turned OFF, a potential on the ouptut terminal 11 is +5 volts through the resistor 10a.

When the input voltage is dropped down to zero volt, the IG-FET 2b is turned ON and the IG-FET 4 is turned OFF. Since, in this case, the voltage variation is rapidly effected, a voltage on the node 7 is rapidly increased and, in consequence, a stray capacitance on the node 8 is also rapidly charged, causing a rapid drop of a voltage on the output terminal 11 to zero volt. When, on the other hand, the input voltage is increased from zero volt to +5 volts, the IG-FET 2b is turned OFF and the IG-FET 4 is turned ON. As a result, a potential on the node 7 becomes substantially zero volt and the stray capacitance on the node 8 is slowly discharged through the remaining channel of the depletion type IG-FET 6. Therefore, the IG-FET 9 is slowly turned OFF, causing the potential on the output terminal 11 to be slowly raised.

Figure 6:
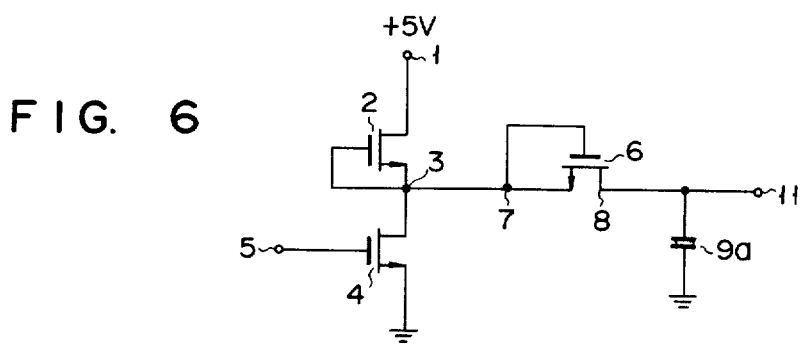
FIG. 6 is a circuit diagram showing another modification of the embodiment of FIG. 1.

Although with the above-mentioned embodiments the stray capacitance is used as a capacitance which is charged and discharged through the transfer gate FET 6, a capacitor element 9a as shown in FIG. 6 may, of course, be used as such. In this case, the capacitor element 9a is rapidly charged through the IG-FET's 2 and 6 and slowly discharged through the IG-FET's 6 and 4. Many modifications may be used as the charge path between the node 3 and the terminal 1, and 9 discharge path between the node 3 and ground. A p-channel type IG-FET may of course be employed in place of the n-channel type IG-FET.

Figure 7:
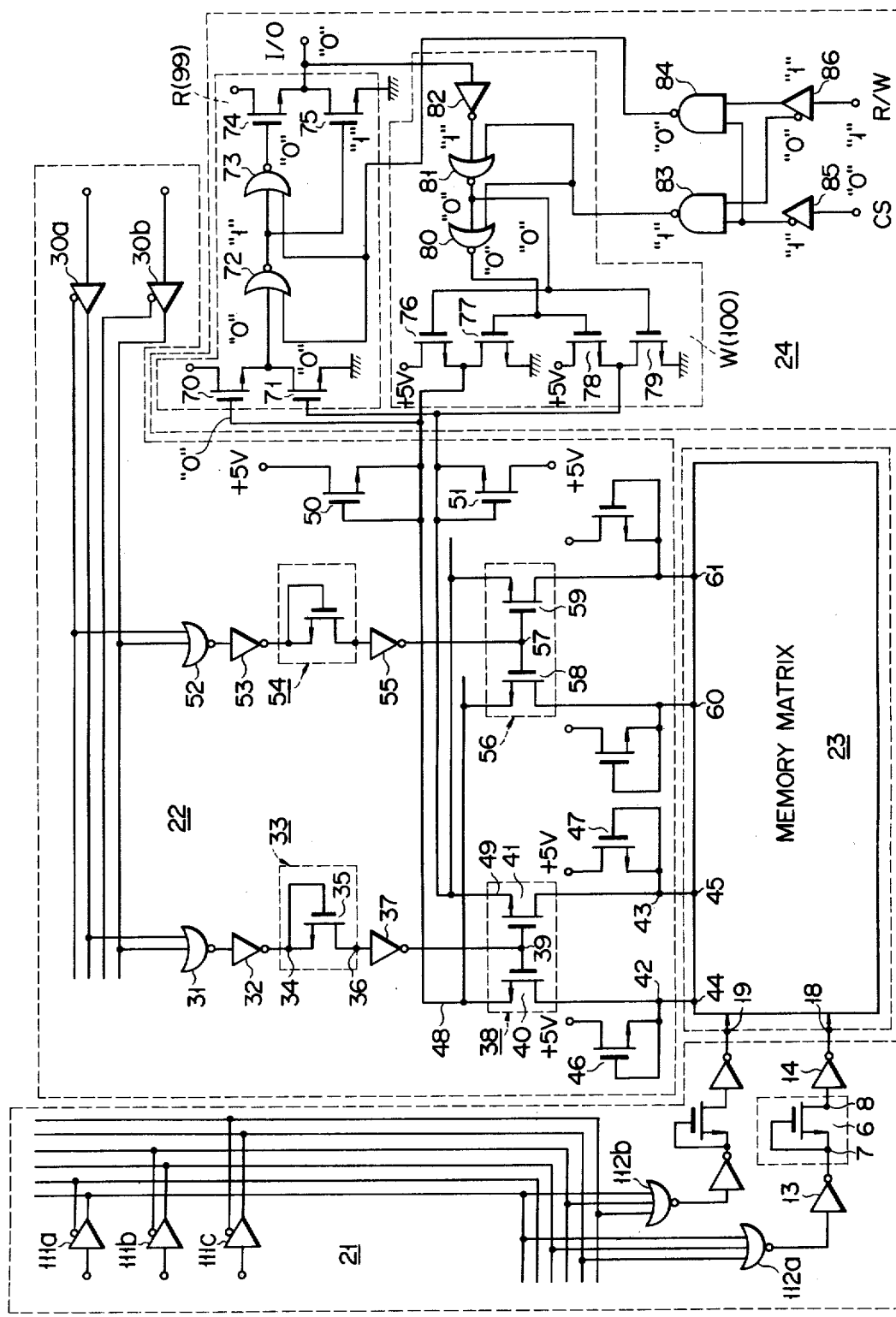
FIG. 7 is a block diagram showing a memory circuit to which this invention is applied.

FIG. 7 shows a block diagram showing the major part of a memory device using a difference in time between the charge and discharge of a capacitance.

In FIG. 7, reference numeral 21 shows a circuit for a row address selection; 22, a circuit for a column address selection; 23, a memory matrix; and 24, an input-/output circuit. These circuits are usually integrated on a single chip. The row and column of the memory matrix may of course be oriented interchangeably.

The outputs of a plurality of row address selecting drivers 111a, 111b and 111c each composed of inverter are suitably connected to decoders 112a and 112b each constituting an NOR gate. For the sake of clarity, only the three row address selecting drivers are shown by way of example. With a full decode system in view, $2^3$ decoders (i.e. 8 decoders) are necessary. In FIG. 7, only the two decoders are shown by way of example. The output of the decoder 112a is connected to the row selecting line of the memory matrix 23 through a decoder output driver having an even number of stages, for example, a two-stage decoder output driver (i.e. 13 and 14), each stage of which consists of an inverter. The decoder output drivers 13 and 14 are not particularly necessary, if the output signal of the decoder 112a is of a magnitude sufficient to drive the memory matrix 23. Between the decoder output drivers 13 and 14 is connected a depletion type IG-FET 6 of n-channel variety. The control gate of the IG-FET 6 is coupled to the source electrode of the IG-FET 6.

The row address selecting drivers 111a, 111b and 111c generate, upon receipt of an input signal, an output signal which is coupled to a predetermined decoder, for example, the decoder 112a. The output of the decoder 112a is delivered through the first decoder output driver 13 to the source electrode of the depletion type IG-FET 6. In the normal state, the output of the decoder 112a takes either one of the states "High" and "Low". In this embodiment, the High state is +5 volts and the Low state is zero volt.

There will now be explained the charging and discharging of a stray capacitance on a node 7 at the input side, i.e. the source electrode side, of the depletion type IG-FET 6 and on a node 8 of the output side i.e. the drain electrode side thereof.

When the node 7 on the source electrode side of the IG-FET 6 is, upon being charged, changed from the Low state to the High state, the gate electrode of the IG-FET 6 which is connected to the source electrode of the IG-FET 6 also assumes the High state. As a result, the source-drain conductance of the IG-FET 6 is increased, causing the stray capacitance on the node 8 to be rapidly charged.

The node 7 on the source electrode of the IG-FET 6 is discharged through the first decoder output driver 13, resulting in a change from the High state to the Low state. At this time, the node 7 is rapidly discharged, thus lowering a potential on the gate electrode of the IG-FET 6. For this reason, the drain-source conductance of the IG-FET 6 becomes small and the node 8 on the drain side of the IG-FET 6 is slowly discharged. It is therefore possible to obtain a great time difference between the delay of rise and the delay of fall of the pulse signal on the node 8 at the drain side of the IG-FET 6. Such charging and discharging characteristics can be properly varied by changing, for example, the threshold voltage, and width-length ratio of the gate electrode, of the depletion type IG-FET 6.

To the node 8 on the drain electrode side of the IG-FET 6 is connected a node 18 on the output side of the second decoder output driver 14. Since the node 8 on the input side of the decoder output driver 14 is rapidly charged and slowly discharged, the node 18 on the output side of the decoder output driver 14 is slowly charged and rapidly discharged.

FIG. 3 shows the time variation of a potential on the node 18, as measured at the charging and discharging times, which is caused upon applying a pulse signal to the decoder 112a of the row address selecting circuit 21. In the graph of FIG. 3 the origin denotes the point in time when the input pulse on the address selecting driver is switched, and a dotted line drawn at the level of 1 volt denotes a threshold voltage necessary to operate the designated row selecting lines of the memory matrix 23. When the voltage on the node 18 falls from 5 volts to below the threshold voltage of 1 volt as shown in FIG. 3, the designated row selecting line of the memory matrix 23 is turned OFF. When, on the other hand, the voltage rises from zero to above 1 volt, the designated row selecting line of the memory matrix 23 is turned ON. The threshold voltage may be suitably selected.

The column address selecting cicuit 22 is essentially similar to the row address selecting circuit 21. The outputs of, for example, two column address selecting drivers 30a and 30b are properly coupled to decoders 31 and 52. The outputs of the decoders 31 and 52 are coupled respectively through first decoder output drivers 32 and 53 to a node on the source side of respective depletion type IG-FET's 33 and 54. The node on the source side of the IG-FET 33 is coupled to the control gate electrode 35 of the IG-FET 33. To the node 36 on the drain electrode side of the depletion type IG-FET 33 is coupled an inverter 37 constituting a second decoder output driver. The output of the second decoder output driver 37 is delivered to the gate electrode 39 of the column selector 38. The charging at the node 36 is fast and discharging is slow in the same way as in the column address selecting circuit. Therefore, the output of the inverter 37 supplied from the node 36, i.e. a common gate electrode 39 of first and second IG-FET's 40 and 41, both constituting the selector 38, has such a charging and discharging characteristic that it is slowly charged and rapidly discharged. The drain electrode 42 of the first IG-FET 40 is coupled to a predetermined digit line 44, while the drain electrode 43 of the second IG-FET 41 is coupled to a predetermined digit line 45. The digit lines 44 and 45 in a pair are connected to transistors 46 and 47, respectively. With one of the paired digit lines having a value of D, the other digit line assumes a value of $\bar{D}$. The transistors 46 and 47 normally supply voltages to the respective digit lines. A node 48 on the source electrode of the first IF-FET is connected to the input and output circuit 24, while a node 49 on the source electrode of the second IG-FET is connected to the input and output circuit 24. Reference numerals 50 and 51 show load resistors for the respective digit lines. To the nodes 48 and 49 is connected the source electrode of three remaining IG-FET's not shown, each constituting a selector.

The arrangement of the memory matrix 23 will be explained by citing a well known static type memory cell.

Figure 9:
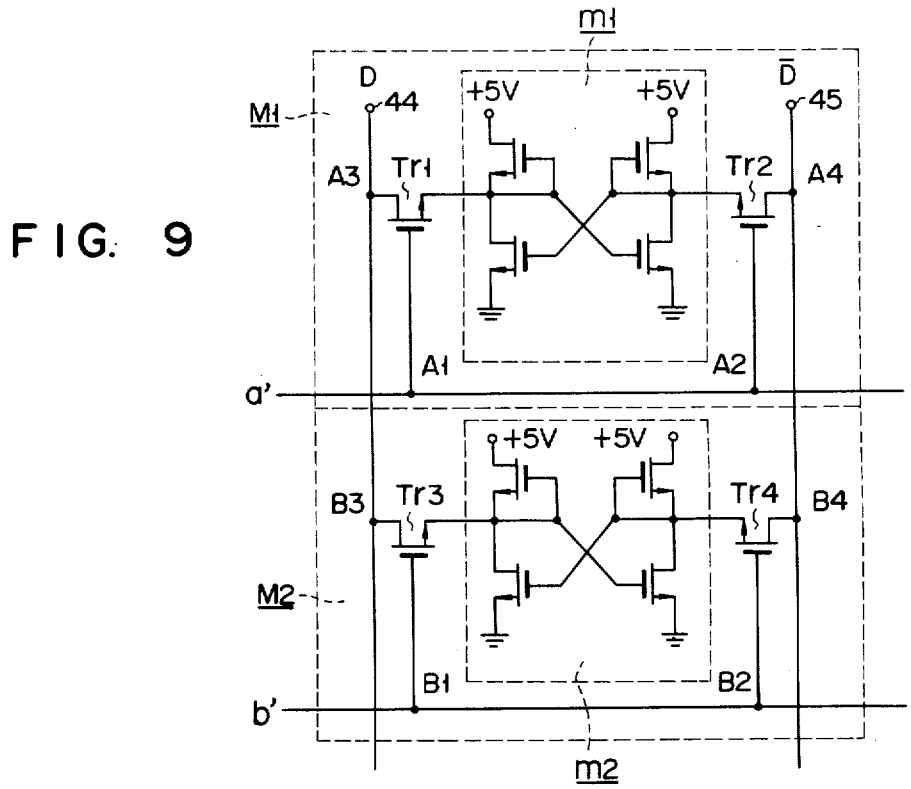
FIG. 9 is a circuit diagram of the memory cell shown in FIG. 7.

FIG. 9 shows amemory cell constituting part of the memory matrix 23. For the sake of clarity only two memories M1 and M2 are shown by way of example. A flip-flop circuit is used in the memory cells M1 and M2. The memory cell M1 consists of a memory cell body m1 and gate transistors Tr1 and Tr2, while the memory cell M2 consists of a memory cell body m2 and gate transistors Tr3 and Tr4. Row selecting lines a' and b' are connected respectively through the gate transistors Tr1 and Tr2, and Tr3 and Tr4, to the memory ells M1 and M2. The row digit line 44 is connected through a point A3 to the memory cell M1 and through a point B3 to the memory cell M2, while the digit line 45 is connected through a point A4 to the memory cell M1 and through a point B4 to the memory cell M2.

Suppose that the row selecting lines a' and b' are connected to the nodes 18 and 19, respectively, in the row address selecting circuit 21. When the row selecting line a' assumes the High state, the transistors Tr1 and Tr2 are held in the "ON" state. Where, for example, a pair of data 1, 0 are read out of the memory cell body m1, they are coupled respectively through the transistors Tr1 and Tr2 one to the digit line 44 and the other to the digit line 45. With the digit line 44 in the High state, the digit line 45 assumes the Low state. The digit lines 44 and 45 are in a reversed relation to each other. With the common gate 39 in the High state and the IG-FET 40 in the ON state, the data coupled to the digit lines 44 and 45 are delivered respectively through the source electrodes 48 and 49 to the input and output circuit 24. Where, with the row selecting line b' in the High state, the memory cell M2 is selected by the row selector, the corresponding data are supplied, likewise, to the input and output circuit 24.

The operation of one embodiment of this invention will be explained on the assumption that the column lines of the memory matrix are held fixed and that an input signal for row address selection is switched.

For ease in explanation, suppose that a first signal is supplied through the decoder 112a to the row selecting line. Next suppose that the row address selecting input signal is switched and that a second signal is supplied through the decoder 112b to the row selecting line b'.

Figure 10:
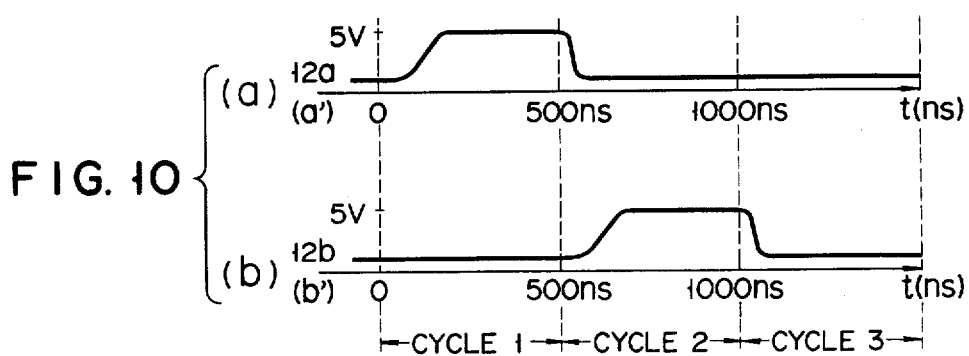
FIG. 10 is a waveform diagram for explaining the operation of the circuit of FIG. 9.

FIG. 10 shows the case where a signal is applied to the row address selecting driver with a cycle time of 500 nano-second and t = 0 and the signal is switched at t = 500 nano-second, a potential on the row selecting line a' being shifted to the Low level and a potential on the row selecting line b' being gradually shifted to the High level. As will be understood from the graph of FIG. 3 a relatively slow charge is effected on the row selecting line a' and after a predetermined cycle time (in this case, 500 nano-second) a rapid discharge is effected by the switching of the signal. At t = 500 nano-second + 78 nano-second, for example, the potential on the row selecting line a' is decreased to 1 volt, causing the transistors Tr1 and Tr2 to be turned OFF. As a result, the memory M1 is completely closed. At t = 500 nano-second, the potential on the row selecting line b' is slowly charged and at t = 500 nano-second + 138 nano-second, for example, increased to 1 volt, causing the transistors Tr3 and Tr4 to be turned ON. In consequence, the memory M2 is opened, permitting an exchange of data between the digit lines 44 and 45. Since according to this invention a different charging time can be provided between the row selecting lines, it is possible to prevent simultaneous opening of the memory cells M1 and M2. If, for example, the transistor Tr3 is turned ON before the transistor Tr1 is turned OFF, the memory bodies m1 and m2 are operatively connected through the transistors Tr1 and Tr3 to cause an erroneous operation such as the mistransfer, mixing etc. of data stored in the memory bodies m1 and m2. According to this invention, however, the other transistor is turned ON after one transistor is completely turned OFF, thus assuring a stabilized operation without involving an erroneous operation. This advantageous feature can be most suitably applied to a full decode type memory. Since the depletion type IG-FET is used as a transfer gate, not as a usual load resistor, it is possible to provide a different charging-discharging time between the row selecting lines without varying the transfer characteristic of the system. Furthermore, the charging-discharging time difference can be adjustably varied in favor of design consideration by suitably changing the gate configuration of the depletion type IG-FET, threshold value etc.

Although the explanation is restricted to the row selecting lines only, the same thing can equally be applied to the column selecting lines. That is, the row decoder 52, first driver 53, depletion type IG-FET 54 having the source and gate electrodes connected in common, second driver 55, gate 57 of the selector 56 are connected as shown in FIG. 7. The IG-FET's 58 and 59 are connected with the common gate 57 left therebetween. The source electrodes of the IG-FET's 58 and 59 are connected to the lines 48 and 49, respectively and the drain electrodes of the IG-FET's 58 and 59 are connected to digit lines 60 and 61, respectively.

Consider now that, with such an arrangement, an input signal to the row address selecting driver is switched. When the selector 38 is shifted, upon receipt of a signal from the decoder 31, from the ON state to the OFF state, a potential on the gate electrode of the selector 38 is rapidly decreased to cause the IG-FET's 40 and 41 to be shifted to the OFF state to permit the selector 38 to assume the closed state. On the other hand, the gate 57 of the selector 56 is slowly charged to cause the IG-FET's 58 and 59 to be slowly shifted to the ON state. In this way, data through the digit lines 44 and 45 are first transmitted to the input and output circuit 24 and, after some length of time, data through the digit lines 60 and 61 are transmitted to the input and ouput circuit 24, thus preventing mixing of data. It is therefore possible to prevent any erroneous operation which would otherwise occur when data is read out of the memory.

A memory matrix read-out/write-in selecting signal and chip selecting signal are coupled to terminals R/W and CS, respectively, of the input and output circuit 24. A terminal I/O of the input and ouput terminal receives an input or generates an output. A plurality of chips (only one is shown in FIG. 7) are provided on the input and output circuit 24. Any one of the chips is selected by applying the signal to the terminal CS. The input and ouput circuit 24 is a usual circuit.

For example, the chip shown in FIG. 7 is selected by applying a signal 0 to the terminal CS of the input and output circuit 24 and then data is read out of the memory. In this case, the flow of the signal is as follows:

Suppose that a potential on the line 48 is 0, and a potential on the line 49 is 1, when data is read out of the memory 23. Since, in this case, an n-channel type IG-FET 70 is turned OFF upon receipt of a signal 0 on the line 48 and an n-channel type IG-FET 71 is turned ON upon receipt of a signal 1 on the line 49, one input of an NOR gate 72 is 0. The signal 0 on the terminal CS is supplied through an inverter 85 to the NAND gate 84 and the signal 1 on the terminal R/W is supplied through an inverter 86 to the NAND gate 84. Since the output of the NAND gate 84 is 0, both the inputs of an NOR gate 72 are 0. As a result, the NOR gate 72 generates an output 1 which, in turn, is coupled to one input of an NOR gate 73 of the succeeding stage. Sine the ouput 0 of the NAND gate 84 is coupled to the other input of the NOR gate 73, the ouput of the NOR gate 73 is 0. The output 0 of the NOR gate 73 is coupled to the gate electrode of n-channel type IG-FET 74. The IG-FET 74 is therefore held in the OFF state. The output 1 of the NOR gate 72 is coupled to the gate electrode of an n-channel type IG-FET 75 to cause the latter to be held in the ON state. Consequently, the potential on the terminal I/O is zero volt, i.e. the output of the terminal I/O is 0. Therefore, a section enclosed by a dotted line block R(99) serves to effect readout operation.

Figure 8:
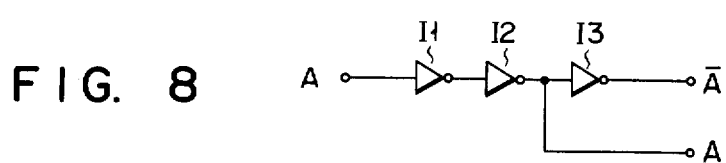
FIG. 8 is a block diagram showing, by way of example, a driver circuit shown in FIG. 7.

Writing data into the memory matrix 23 is effected by applying a signal 0 to the terminals CS and R/W to select a predetermined address through a circuit W(100) and, at the same time, supplying a data signal to the terminal I/O. It should be noted that the logical level on each part of the input and ouput circuit 24 in FIG. 7 is that level assumed at the readout time. At the write-in time the input of the terminal R/W is 0. In this case, the ouput of the NAND gate is 0 and that of the gate 84 is 1. If the level on the terminal I/O is 0, the output of the inverter 82 is 1 and both the inputs of the NOR gate 81 are 1 and 0, respectively. Consequently, the NOR gate 80 generates an ouput 1. The output 1 of the NOR gate 80 is delivered to the gates of the n-channel type IG-FET's 77 and 78 to cause the latter to be turn ON. Since, on the other hand, the n-chanel IG-FET's 76 and 79 are held in the OFF state by the output 0 of the NOR gate 81, a signal 0 is passed through the line 48 and a signal 1 is passed through the line 49. An inverter circuit for generating two ouputs, opposite in polarity to each other, with respect to one input from the drivers 111a to 111c, 30a, 30b etc. as shown in FIG. 7 is comprised of, for example, three usual inverters 11, 12 and 13 as shown in FIG. 18. A signal A to an input terminal is derived, as two signals A and $\overline{A}$ opposite in polarity to each other, from an output terminal as shown in FIG. 8.

There will be explained by reference to FIGS. 11 to 16 embodiments of this invention as applied to a waveform shaping circuit.

A waveform shaping circuit of FIG. 11 is entirely similar in arrangement to the circuit of FIG. 1 and any further explanation is, therefore, omitted by applying the same reference numeral to parts or elements corresponding to those shown in FIG. 1.

When a pulse signal with a waveform as shown in FIG. 12(a) is applied to an input terminal 5 in FIG. 11, an IG-FET 4 is turned ON at time A1. The pulse signal is delayed by a time required for an IG-FET 9 to be turned OFF and a potential on an ouput terminal 11 becomes a high level as shown in FIG. 12(b). When at time t2 the input becomes zero, the IG-FET's 6 and 9 are almost simultaneously turned ON and an output level becomes zero. In consequence, a pulse input corresponding to a time width (t2 − t1) is generated as a pulse of a narrow width corresponding to a delay due to the discharge of a stray capacitance.

FIG. 13 shows an embodiment in which the gate and drain electrodes of a depletion type IG-FET 6 are connected in common. At the drain electrode side of the IG-FET 6 a slow charge and rapid discharge result. In consequence, a rapid rise of output is effected with respect to a rise of input and the fall of the ouput is delayed with respect to the fall of the input. A pulse output of a width as shown in FIG. 14(b) is therefore obtained with respect to an input as shown in FIG. 14(a).

FIG. 15 shows an embodiment in which use is made as a transfer gate of series-connected depletion-type IG-FET's 6a and 6b. The gate and drain electrodes of the IG-FET 6a are connected to each other, while the gate and source electrodes of the IG-FET 6b are connected to each other. As shown in FIG. 16, therefore, it is possible to obtain an output pulse of a width substantially the same as that of an input pulse, i.e. an ouput pulse whose phase is shifted with respect to the input pulse, as shown in FIGS. 16(a) and (b).

Figure 17:
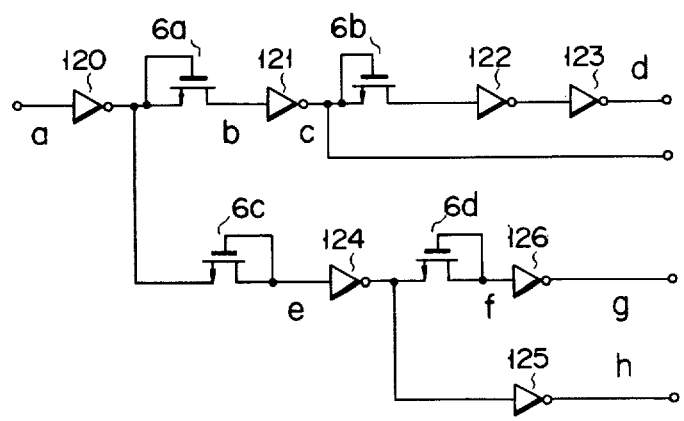
FIG. 17 is a circuit diagram showing an embodiment of this invention as applied to a timing signal generating circuit.

FIG. 17 shows an embodiment of this invention as applied to a timing signal generating circuit. In FIG. 17, an input signal a as shown in FIG. 18(a) is supplied through an inverter 120 to a junction between the gate and source electrodes of an IG-FET 6a. In consequence, an output signal b on the drain electrode of the IG-FET 6a has a narrow pulse width as shown in FIG. 18(b) which is similar to the narrow pulse width as shown in FIGS. 11 and 12. The output signal b is coupled to an inverter 121 where an inversed signal c as shown in FIG. 18(c) is obtained. The signal c is derived as one output signal of the timing signal generating circuit from one output terminal and, at the same time, is coupled to a junction between the gate and source electrodes of an IG-FET 6b. As explained in connection with FIGS. 13 and 14, the ouput of the IG-FET 6b has a wide pulse width with respect to that of the input signal c. The output of the IG-FET 6b is coupled to a two stage inverter (i.e. inverters 122 and 123) where an ouput of a wide pulse width as shown in FIG. 18(d) is obtained. The output of the inverter 120 is also coupled to the source of another depletion type IG-FET 6c. The gate and drain electrodes of the IG-FET 6c are connected to each other. Consequently, a signal e with a wide pulse width as shown in FIG. 18(e) is obtained at the drain electrode side of the IG-FET 6c with the respect to the inversed ouput of the inverter 120. The output signal e of the IG-FET 6c is derived, through inverters 124 and 125, as one output h of the timing signal generating circuit. The output of the inverter 124 is also coupled to the source electrode of a depletion type IG-FET 6d. Since the gate and drain electrodes of the IG-FET 6d are connected to each other, an output signal f at the source electrode side of the IG-FET 6d has a narrower pulse width as shown in FIG. 18(f) than the width of the signal e. The output f is coupled to an inverter 126 where an inverted signal g as shown in FIG. 18(g) is obtained.

Though the above-mentioned embodiments use the n-channel type IG-FET, the same result can also be obtained by employing a p-channel type IG-FET.

What we claim is:

1. A semiconductor circuit device comprising: a transfer gate circuit including at least one first depletion type IG-FET of one conduction type channel having first and second electrodes and a gate electrode connected to one of said first and second electrodes, a capacitance connected between ground and a node at the output side of said transfer gate circuit, and a capacitance charging and discharging circuit connected to the input side of said transfer gate circuit so as to charge and discharge said capacitance.

2. A semiconductor circuit device according to claim 1, in which said transfer gate circuit is comprised of a first depletion type n-channel IG-FET having source and gate electrodes connected in common to the output side of said capacitance charging and discharging circuit.

3. A semiconductor circuit device according to claim 1, in which said transfer gate circuit is comprised of a first depletion type n-channel IG-FET having a source electrode connected to the output side of said capacitance charging and discharging circuit and gate and drain electrodes connected in common to said node at the output side of said transfer gate circuit.

4. A semiconductor circuit device according to claim 1, in which said transfer gate circuit comprises a first depletion type IG-FET whose gate and drain electrodes are connected to each other, and a second depletion type IG-FET connected in series with the first depletion type IG-FET and having its gate and source electrodes connected to each other.

5. A semiconductor circuit device according to claim 1, in which said capacitance charging and discharging circuit comprises a power source terminal, a charging circuit including a second depletion type IG-FET connected between said power source terminal and an input terminal of said transfer gate circuit and having its gate and source electrodes connected in common with each other, and a discharge circuit including a first enhancement type IG-FET connected between ground and the input side of said transfer gate circuit and having a gate electrode connected to receive an input signal.

6. A semiconductor circuit device according to claim 1, in which said capacitance charging and discharging circuit comprises a power source terminal, a charging circuit including a first enhancement type IG-FET connected between said power source terminal and an input terminal of said transfer gate circuit and having its gate and drain electrodes connected in common with each other, and a discharging circuit including a second enhancement type IG-FET connected between ground and the input side of said transfer gate circuit and having a gate electrode connected to receive an input signal.

7. A semiconductor device according to claim 1, in which said capacitance charging and discharging circuit comprises a power source terminal, a charging circuit including a resistive element connected between said power source terminal and an input terminal of said transfer gate circuit, and a discharging circuit including a first enhancement type IG-FET connected between ground and an input terminal of said transfer gate circuit and having a gate electrode connected to receive an input signal.

8. A semiconductor circuit device according to claim 1, in which said capacitance is a stray capacitance including a gate capacitance of a first enhancement type IG-FET having its gate electrode connected to said node at the output side of said transfer gate circuit.

9. A semiconductor circuit device according to claim 1, in which said capacitance is a capacitance element connected between ground and the output side of the transfer gate circuit.

10. A semiconductor circuit device according to claim 1, further including an inverter circuit comprising an enhancement type IG-FET having its gate electrode connected to said node at the output of said transfer gate circuit and its source electrode grounded, and a depletion-type IG-FET connected between said enhancement type IG-FET and a power source terminal.

* * * * *